United States Patent
Chun et al.

(10) Patent No.: US 9,269,865 B2
(45) Date of Patent: Feb. 23, 2016

(54) NANOSTRUCTURE SEMICONDUCTOR LIGHT EMITTING DEVICE

(71) Applicant: SAMSUNG ELECTRONICS CO., LTD., Suwon-si, Gyeonggi-do (KR)

(72) Inventors: Dae Myung Chun, Hwaseong-si (KR); Jung Sub Kim, Hwaseong-si (KR); Jin Sub Lee, Suwon-si (KR); Sam Mook Kang, Osan-si (KR); Yeon Woo Seo, Hwaseong-si (KR); Han Kyu Seong, Seoul (KR); Young Jin Choi, Seoul (KR); Jae Hyeok Heo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/516,470

(22) Filed: Oct. 16, 2014

(65) Prior Publication Data

US 2015/0236202 A1 Aug. 20, 2015

(30) Foreign Application Priority Data

Feb. 18, 2014 (KR) .................. 10-2014-0018699

(51) Int. Cl.
*H01L 33/24* (2010.01)
*H01L 33/08* (2010.01)
*H01L 33/62* (2010.01)

(52) U.S. Cl.
CPC .............. *H01L 33/24* (2013.01); *H01L 33/08* (2013.01); *H01L 33/62* (2013.01)

(58) Field of Classification Search
CPC .......... H01L 33/24; H01L 33/08; H01L 33/62
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |

(Continued)

FOREIGN PATENT DOCUMENTS

| | | |
|---|---|---|
| KR | 10-2012-0029215 A | 3/2012 |
| KR | 10-2012-0055390 A | 5/2012 |
| KR | 10-2012-0055391 A | 5/2012 |

*Primary Examiner* — Roy Potter
*Assistant Examiner* — Paul Patton
(74) *Attorney, Agent, or Firm* — McDermott Will & Emery LLP

(57) ABSTRACT

A nanostructure semiconductor light emitting device may include a first conductivity-type semiconductor base layer, a mask layer disposed on the base layer and having a plurality of openings exposing portions of the base layer, a plurality of light emitting nanostructures disposed in the plurality of openings, and a polycrystalline current suppressing layer disposed on the mask layer. At least a portion of the polycrystalline current suppressing layer is disposed below the second conductivity-type semiconductor layer. Each light emitting nanostructure includes a first conductivity-type semiconductor nanocore, an active layer, and a second conductivity-type semiconductor layer.

20 Claims, 17 Drawing Sheets

(56) References Cited

U.S. PATENT DOCUMENTS

| | | |
|---|---|---|
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2004/0048409 A1 | 3/2004 | Biwa et al. |
| 2011/0309382 A1* | 12/2011 | Lowgren ............... B82Y 20/00 257/88 |
| 2012/0161100 A1 | 6/2012 | Hsu |
| 2013/0015477 A1 | 1/2013 | Kim et al. |

\* cited by examiner

NANOSTRUCTURE SEMICONDUCTOR LIGHT EMITTING DEVICE

CROSS-REFERENCE TO RELATED APPLICATION

This application claims the benefit of Korean Patent Application No. 10-2014-0018699 filed on Feb. 18, 2014, with the Korean Intellectual Property Office, the disclosure of which is incorporated herein by reference.

BACKGROUND

The present disclosure relates to a nanostructure semiconductor light emitting device.

A light emitting diode (LED) is a semiconductor light emitting device including a material that emits light when electrical energy is applied thereto. Energy generated through electron-hole recombination in semiconductor junction parts is converted into light that is to be emitted therefrom. The LED has various advantages such as relatively long lifespan, low power consumption, rapid response speed, environmental friendliness, and the like, as compared to conventional light sources. The LED is commonly used as light sources in lighting devices, display devices, and the like.

In recent years, as a new type of a semiconductor LED technology, the semiconductor light emitting device using nanostructures has been developed in order to increase a luminous efficiency through enhancements in crystallinity and increases in light emitting areas.

SUMMARY

An exemplary embodiment in the present disclosure may provide a nanostructure semiconductor light emitting device having a novel structure that reduces a leakage current caused by light emitting nanostructures and alleviates a problematic wavelength conversion of emitted light.

According to an exemplary embodiment in the present disclosure, a nanostructure semiconductor light emitting device may include a first conductivity-type semiconductor base layer, a mask layer disposed on the base layer and having a plurality of openings exposing portions of the base layer, a plurality of light emitting nanostructures disposed in the plurality of openings, and a polycrystalline current suppressing layer disposed on the mask layer. At least a portion thereof is disposed below the second conductivity-type semiconductor layer. Each light emitting nanostructure includes a first conductivity-type semiconductor nanocore, an active layer, and a second conductivity-type semiconductor layer.

The second conductivity-type semiconductor layer may include a charge carrier blocking layer disposed on the active layer and a second conductivity-type contact layer disposed on the charge carrier blocking layer.

The polycrystalline current suppressing layer may include a first polycrystalline layer disposed on the mask layer to be in contact with the charge carrier blocking layer and a second polycrystalline layer disposed on the first polycrystalline layer to be in contact with the second conductivity-type contact layer.

The first polycrystalline layer may include at least one of elements constituting the charge carrier blocking layer and at least one of elements constituting the mask layer.

The charge carrier blocking layer may include a semiconductor single crystal layer containing aluminium (Al). The mask layer may include a silicon compound having electrical insulating properties. The first polycrystalline layer may include a polycrystalline layer formed of a silicon compound containing aluminium (Al).

The mask layer may be formed of a silicon oxide, a silicon nitride or a silicon oxynitride.

The second polycrystalline layer may include a polycrystalline layer formed of the same compound as that of the second conductivity-type contact layer.

The polycrystalline current suppressing layer may have a thickness of 30 nm to 400 nm.

The nanostructure semiconductor light emitting device may further include a contact electrode layer disposed on the second conductivity-type semiconductor layer and the polycrystalline current suppressing layer.

The nanostructure semiconductor light emitting device may further include a filling layer that is disposed on the contact electrode layer and fills space between the light emitting nanostructures.

The nanocore includes a rod portion and a tip portion having different crystal planes. A current blocking intermediate layer may be further disposed in the tip portion and be positioned between the nanocore and the active layer.

The current blocking intermediate layer may be intentionally undoped or may be doped with a second conductivity-type impurity.

According to another exemplary embodiment in the present disclosure, a nanostructure semiconductor light emitting device may include a first conductivity-type semiconductor base layer, an insulating layer disposed on the base layer and having a plurality of openings exposing portions of the base layer, a plurality of light emitting nanostructures disposed in the plurality of openings, and a polycrystalline current suppressing layer disposed on the insulating layer. Each light emitting nanostructure includes a first conductivity-type semiconductor nanocore, an active layer, and a second conductivity-type semiconductor layer. The polycrystalline current suppressing layer is formed of a polycrystalline compound containing at least a portion of elements constituting the second conductivity-type semiconductor layer.

The plurality of light emitting nanostructures may be formed of a nitride semiconductor material. The second conductivity-type semiconductor layer may include a nitride semiconductor layer containing aluminium (Al). At least a portion of elements constituting the second conductivity-type semiconductor layer may include aluminium (Al).

The nitride semiconductor layer containing aluminium (Al) may be a charge carrier blocking layer disposed on the active layer, and the polycrystalline current suppressing layer may be in contact with the charge carrier blocking layer.

BRIEF DESCRIPTION OF DRAWINGS

The above and other aspects, features and advantages of the present disclosure will be more clearly understood from the following detailed description taken in conjunction with the accompanying drawings, in which.

DETAILED DESCRIPTION

Figure 1:
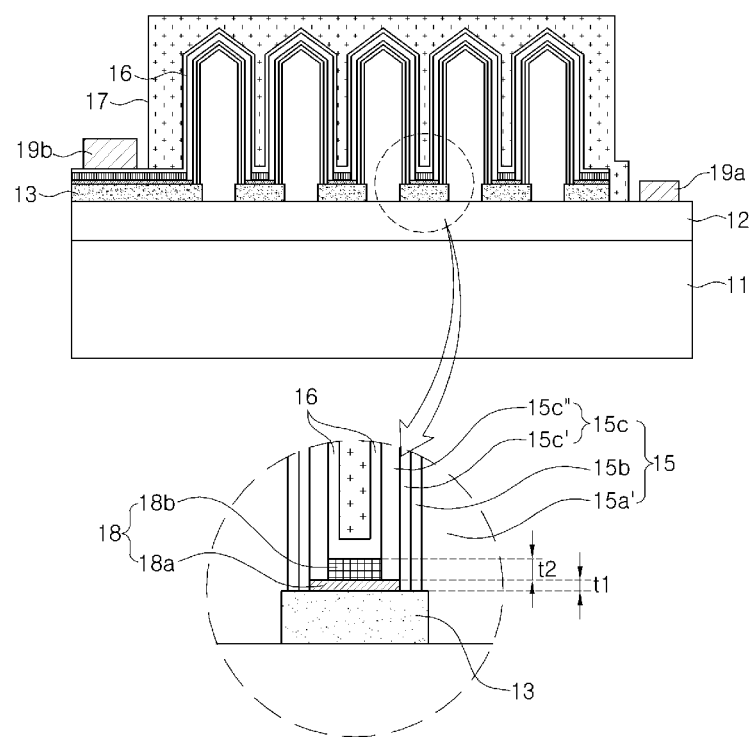
FIG. 1 is a cross-sectional view illustrating a nanostructure semiconductor light emitting device according to an exemplary embodiment of the present disclosure.

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements maybe exaggerated for clarity, and the same reference numerals will be used throughout to designate the same or like elements.

FIG. 1 is a cross-sectional view of a nanostructure semiconductor light emitting device according to an exemplary embodiment of the present disclosure.

Referring to FIG. 1, a nanostructure semiconductor light emitting device 10 may include a first conductivity-type semiconductor base layer 12 and a plurality of light emitting nanostructures 15 disposed on the base layer 12.

Each light emitting nanostructure 15 may have a core-shell structure including a first conductivity-type semiconductor nanocore 15a' grown from the first conductivity-type semiconductor base layer 12, an active layer 15b and a second conductivity-type semiconductor layer 15c.

The first conductivity-type semiconductor base layer 12 maybe formed on a substrate 11. The base layer 12 may provide a crystal plane for growing the first conductivity-type semiconductor nanocores 15a' in the light emitting nanostructures 15. The base layer 12 may serve as a contact electrode by which portions thereof are mutually connected to one ends of the light emitting nanostructures 15. The first conductivity-type semiconductor base layer 12 may be formed of a nitride semiconductor containing $Al_xIn_yGa_{1-x-y}N$ ($0 \leq x < 1$, $0 \leq y < 1$, $0 \leq x+y < 1$). For example, the base layer 12 may be formed of GaN doped with an n-type impurity.

The substrate 11 may be provided as a semiconductor growth substrate. The substrate 11 may be an insulating substrate, a conductive substrate or a semiconductor substrate. For example, the substrate 11 may be formed of sapphire, SiC, Si, $MgAl_2O_4$, MgO, $LiAlO_2$, $LiGaO_2$, GaN or the like. In a case that the substrate 11 is formed of sapphire, a crystal having Hexa-Rhombo R3c symmetry, the sapphire substrate has a lattice constant of 13.001 Å along a C-axis and a lattice constant of 4.758 Å along an A-axis, and includes a C (0001) plane, an A (11-20) plane, an R (1-102) plane, and the like. The C plane is mainly used as a substrate for nitride semiconductor growth because it facilitates growth of a nitride film and is stable at high temperatures. Meanwhile, in a case in which the substrate 11 is formed of Si, the Si substrate may be easily formed to have a large diameter and may be relatively cheap, whereby manufacturing yields may be improved. Although not shown, uneven portions may be formed on a surface of the substrate 11, in order to improve a light extraction efficiency. A buffer layer may be further provided to improve crystalline properties of the first conductivity-type semiconductor base layer 12. The buffer layer may, for example, be formed of $Al_xGa_{1-x}N$ ($0 \leq x \leq 1$) grown at low temperatures without doping.

Figure 4A:
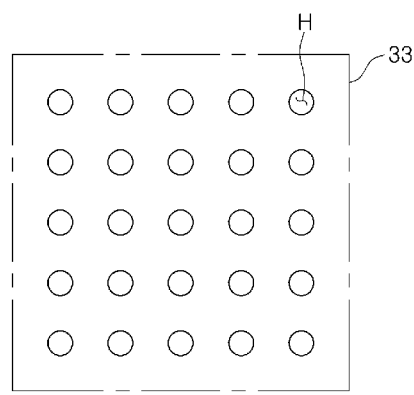
FIGS. 4A and 4B are plan views illustrating examples of a mask applicable to exemplary embodiments of the present disclosure, in which openings are formed to have various shapes.
Figure 4B:
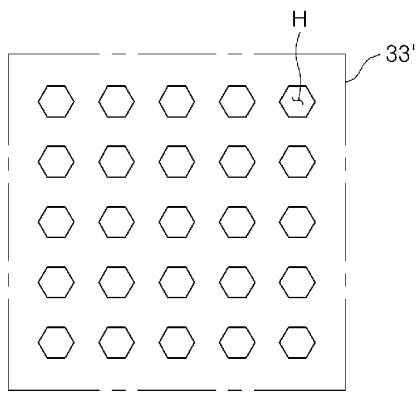

A mask layer 13 having a plurality of openings H may be disposed on the base layer 12 for growth of the nanocores 15a'. Portions of the base layer 12 may be exposed through the openings H, and the nanocores 15a' maybe formed on the exposed portions of the base layer 12. That is, the mask layer 13 may be used as a mask for the growth of the nanocores 15a'. The mask layer 13 may be formed of an insulating material such as $Si_xN_y$, $SiO_x$, $SiO_xN_y$, $Al_2O_3$ or AlN. The plurality of openings H may have various shapes such as a circular shape, a quadrangular shape, a hexagonal shape or the like. According to an exemplary embodiment, sizes of the openings and pitches between the openings H may be varied. For example, the openings H may be shaped as illustrated in FIGS. 4A and 4B, and may have a size of 500 nm or smaller, specifically, 200 nm or smaller.

Similar to the base layer 12, the nanocore 15a' may be formed of a nitride semiconductor material containing $Al_xIn_yGa_{1-x-y}N$ ($0 \leq x < 1$, $0 \leq y < 1$, $0 \leq x+y \leq 1$). For example, the nanocore 15a' may be GaN doped with an n-type impurity.

The active layer 15b may be disposed on a surface of the nanocore 15a'. The active layer 15b may emit light having a predetermined level of energy through a electron-hole recombination. The active layer 15b may have a single layer structure formed of a single material such as InGaN or the like or a multi-quantum well (MQW) structure in which quantum barrier layers and quantum well layers are alternately stacked. In the case in which the active layer 15b is formed of a nitride semiconductor, it may have an InGaN/GaN structure, and a wavelength of light may be varied according to a content of indium (In) within the active layer 15b.

The second conductivity-type semiconductor layer 15c may include a charge carrier blocking layer 15c' disposed on the active layer 15b and a second conductivity-type contact layer 15c" disposed on the charge carrier blocking layer 15c'. The charge carrier blocking layer 15c' maybe disposed between the active layer 15b and the second conductivity-type contact layer 15c". The charge carrier blocking layer 15c' may prevent charge carriers, which are injected from the nanocores 15a', from moving toward the second conductivity-type contact layer 15c" without being used for the electron-hole recombination, thereby preventing degradation of a luminous efficiency. For example, in a case in which the nanocore 15a' formed of the first conductivity-type semiconductor is an n-type semiconductor, the charge carrier blocking layer 15c' may serve as an electron blocking layer. In a case in which the nanocore 15a' formed of the first conductivity-type semiconductor is a p-type semiconductor, the charge carrier blocking layer 15c' may serve as a hole blocking layer. Therefore, the charge carrier blocking layer 15c' may include a material having high bandgap energy such as AlGaN or AlInGaN. As a content of aluminium (Al) increases, the bandgap energy may increase. In a case in which indium (In) is added thereto, crystalline properties may be enhanced.

The charge carrier blocking layer 15c' may include the same impurity as that of the second conductivity-type contact layer 15c". For example, the charge carrier blocking layer 15c' may include a p-type impurity such as Mg or Zn. In addition, both the charge carrier blocking layer 15c' and the second conductivity-type contact layer 15c" may include Mg as the impurity. A concentration of the impurity within the charge carrier blocking layer 15c' may be half or less of that of the impurity within the second conductivity-type contact layer 15c". A thickness of the charge carrier blocking layer 15c' may be less than that of the second conductivity-type contact layer 15c". The charge carrier blocking layer 15c' may have an average thickness range of approximately 10 nm to 50 nm.

The second conductivity-type contact layer 15c" may be a semiconductor layer containing p-type $Al_xIn_yGa_{1-x-y}N$ ($0 \leq x < 1$, $0 \leq y < 1$, $0 \leq x+y \leq 1$). For example, the second conductivity-type contact layer 15c" maybe p-type GaN doped with magnesium (Mg).

The nanostructure semiconductor light emitting device 10 may include a polycrystalline current suppressing layer 18. A thickness of the polycrystalline current suppressing layer 18 may range from 30 nm to 400 nm. The polycrystalline current suppressing layer 18 may be disposed on the mask layer 13. At least a portion of the polycrystalline current suppressing layer 18 may be positioned below the second conductivity-type semiconductor layer 15c. The polycrystalline current suppressing layer 18 may suppress a leakage current occurring between the mask layer 13 and the semiconductor layers in a lower portion of the light emitting nanostructure 15. The polycrystalline current suppressing layer 18 may include a first polycrystalline layer 18a disposed on a surface of the mask layer 13 and a second polycrystalline layer 18b disposed on the first polycrystalline layer 18a. A thickness t1 of the first polycrystalline layer 18a may be less than a thickness t2 of the second polycrystalline layer 18b. The first polycrystalline layer 18a may be extended below the second conductivity-type contact layer 15c" to be in contact with the charge carrier blocking layer 15c'. In some cases, the first polycrystalline layer 18a may be extended below the charge carrier blocking layer 15c' to be in contact with the active layer 15b. The arrangement of the polycrystalline current suppressing layer 18 illustrated in FIG. 1 is not limited thereto. The first polycrystalline layer 18a may include at least one of the elements constituting the charge carrier blocking layer 15c' and at least one of the elements constituting the mask layer 13. For example, in a case in which the charge carrier blocking layer 15c' includes a semiconductor containing aluminium (Al) such as AlGaN and the mask layer 13 includes a silicon compound having electrical insulating properties such as silicon nitride (e.g. $Si_xN_y$), the first polycrystalline layer 18a may include a polycrystalline layer formed of a silicon compound containing aluminium (Al) such as Al-Si-N. A thickness of the first polycrystalline layer 18a may range from approximately 30 nm to 50 nm. The second polycrystalline layer 18b of the polycrystalline current suppressing layer 18 maybe disposed between the nanocores 15a' to be in contact with the second conductivity-type contact layer 15c". The second polycrystalline layer 18b may include a polycrystalline layer formed of the same compound as that of the second conductivity-type contact layer 15c" and doped with the same impurity as that of the second conductivity-type contact layer 15c". For example, the second polycrystalline layer 18b may be a p-type GaN polycrystalline layer doped with magnesium (Mg) . According to exemplary embodiments, a thickness of the second polycrystalline layer 18b may range from 70 nm to 350 nm, or the polycrystalline current suppressing layer 18 may be provided without including the second polycrystalline layer 18b.

The nanostructure semiconductor light emitting device 10 may include a contact electrode layer 16 disposed on the second conductivity-type semiconductor layer 15c. The contact electrode layer 16 may cover the plurality of light emitting nanostructures 15 and may be continuously disposed between adjacent light emitting nanostructures. Therefore, the contact electrode layer 16 may be disposed on the polycrystalline current suppressing layer 18. The contact electrode layer 16 may serve as a contact electrode by which portions thereof are mutually connected to the other ends of the light emitting nanostructures 15. The contact electrode layer 16 may be formed of a transparent electrode material to emit light in a direction opposite to the substrate 11. For example, the transparent electrode material may be ITO (Indium tin Oxide), AZO (Aluminium Zinc Oxide), IZO (Indium Zinc Oxide), ZnO, GZO (ZnO:Ga), $In_2O_3$, $SnO_2$, CdO, $CdSnO_4$, or $Ga_2O_3$. According to exemplary embodiments, the contact electrode layer 16 may include graphene. Without being limited thereto, the contact electrode layer 16 may include Ag, Ni, Al, Rh, Pd, Ir, Ru, Mg, Zn, Pt, Au or the like, or may have a two or more layer structure formed of Ni/Ag, Zn/Ag, Ni/Al, Zn/Al, Pd/Ag, Pd/Al, Ir/Ag, Ir/Au, Pt/Ag, Pt/Al, Ni/Ag/Pt or the like. According to exemplary embodiments, a reflective electrode structure may be used to achieve a flip-chip structure.

The nanostructure semiconductor light emitting device 10 may include a filling layer 17 disposed on the contact electrode layer 16 and filling space between the light emitting nanostructures 15. The filling layer 17 may serve to protect the light emitting nanostructures 15. Even after the contact electrode layer 16 is formed, the space may be present between the light emitting nanostructures 15 and may be filled with the filling layer 17. In some cases, the filling layer 17 may include voids to alleviate external impacts. According to exemplary embodiments, an upper surface of the filling layer 17 may be formed to be uneven along the light emitting nanostructures 15. The filling layer 17 may be formed of a light transmissive insulating material. For example, the filling layer may include $SiO_2$, $SiN_x$, $Al_2O_3$, $HfO_2$, $TiO_2$ or $ZrO_2$. Specifically, in order to facilitate the filling of the space between the light emitting nanostructures 15, TEOS (Tetra-EthylOrthoSilane), BPSG (BoroPhosphoSilicate Glass), CVD-$SiO_2$, SOG (Spin-on Glass), or SOD (Spin-on Delectric) may be used for the filling layer 17.

According to exemplary embodiments, the contact electrode layer 16 may be formed to fill all or some of the space between the light emitting nanostructures 15.

The nanostructure semiconductor light emitting device 10 may include first and second electrodes 19a and 19b. The first electrode 19a may be disposed on an exposed portion of the first conductivity-type semiconductor base layer 12. Also, the second electrode 19b may be disposed on an exposed region of the contact electrode layer 16. The first and second electrodes 19a and 19b may have a single layer structure or a multilayer structure formed of a conductive material. For example, the first and second electrodes 19a and 19b may include at least one of Au, Ag, Cu, Zn, Al, In, Ti, Si, Ge, Sn, Mg, Ta, Cr, W, Ru, Rh, Ir, Ni, Pd, Pt and alloys thereof.

According to exemplary embodiments, in a case in which the substrate 11 is formed of a conductive material, the first electrode 19a may be disposed on the bottom of the substrate 11 or may be omitted. The exemplary arrangement and shape of the first and second electrodes 19a and 19b illustrated in FIG. 1 may be varied.

The nanostructure semiconductor light emitting device 10 according to the exemplary embodiment may be manufactured through various methods. FIGS. 3A through 3D illustrate an example of a method of manufacturing the nanostructure semiconductor light emitting device, in which a process of growing first conductivity-type semiconductor nanocores 35a using a mask layer 33 as a mold may be performed.

Figure 3A:
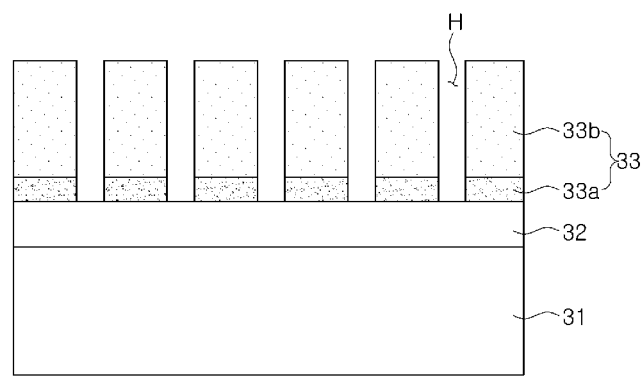
FIGS. 3A through 3D are cross-sectional views illustrating major processes in a method of manufacturing the nanostructure semiconductor light emitting device according to the exemplary embodiment of the present disclosure.

As illustrated in FIG. 3A, a base layer 32 may be provided by growing a first conductivity-type semiconductor on a substrate 31. Although not shown, a buffer layer may be formed on the substrate 31 in order to enhance the crystallinity of the base layer 32. The base layer 32 may provide a crystal growth surface for growing light emitting nanostructures thereon. Therefore, the base layer 32 may be formed of a semiconductor single crystal having electrical conductivity. The mask layer 33 having a plurality of openings H and including an etching stop layer may be formed on the base layer 32.

The mask layer 33 used in the exemplary embodiment may include a first mask layer 33a formed on the base layer 32, and a second mask layer 33b formed on the first mask layer 33a. An etching rate of the first mask layer 33a may be lower than that of the second mask layer 33b under the same etching conditions. The first and second mask layers 33a and 33b may be formed of different materials to obtain a difference in etching rates. For example, the first mask layer 33a may be formed of $Si_xN_y$ or the like, and the second mask layer 33b may be formed of $SiO_2$, $TiO_2$, $Al_2O_3$ or the like. An overall thickness of the mask layer 33 may be designed in consideration of a desired height of a nanostructure for a luminous efficiency and a structural stability. An etching stop level by the first mask layer 33a may be set in consideration of an overall height of the mask layer 33 from the surface of the base layer 32. After the first and second mask layers 33a and 33b are sequentially formed on the base layer 32, a plurality of openings H may be formed in the first and second mask layers 33a and 33b to expose regions of the base layer 32 therethrough. The size of each opening H may be designed in consideration of a desired size of the light emitting nanostructure.

The openings H may be formed through a semiconductor process, and may be formed to have a relatively high aspect ratio through a deep-etching process. The openings H may have an aspect ratio of 5:1 or higher, specifically, 10:1 or higher.

Cross-sectional shapes of the openings H and arrangements thereof may be variously modified. For example, the opening H may have various cross-sectional shapes such as a polygonal shape, a quadrangular shape, an elliptical shape or a circular shape. The mask layer 33 illustrated in FIG. 3A may have an array of openings H having a circular cross-section as illustrated in FIG. 4A, but the openings of the mask layer may have any other shapes and arrangements according to exemplary embodiments. For example, the mask layer 33 may have an array of openings H having a regular hexagonal cross-section, like a mask layer 33' as illustrated in FIG. 4B.

Figure 3B:
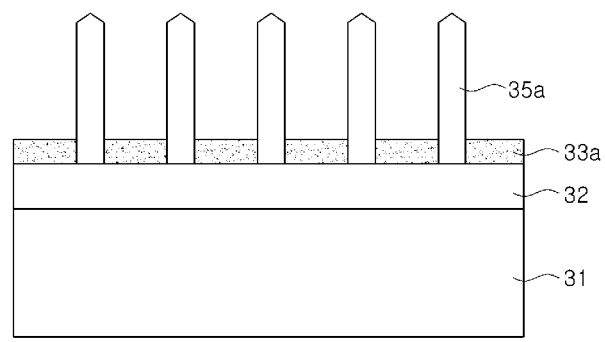

Next, as illustrated in FIG. 3B, a first conductivity-type semiconductor may be grown on the exposed regions of the base layer 32 to fill the plurality of openings H, to form a plurality of first conductivity-type semiconductor nanocores 35a. Then, the mask layer 33 may be partially removed to the level of the first mask layer 33a serving as an etching stop layer to expose a portion of the side surfaces of the plurality of first conductivity-type semiconductor nanocores 35a. That is, by using an etching process that selectively removes the second mask layer 33b, only the second mask layer 33b may be removed, while the first mask layer 33a may be retained. The residual first mask layer 33a may serve to prevent an active layer 35b, a charge carrier blocking layer 35c' and a second conductivity-type contact layer 35c'' from being connected to the base layer 32 in a follow-up growth process.

The first conductivity-type semiconductor of the nanocores 35a may be an n-type nitride semiconductor and may be a material identical to that of the first conductivity-type semiconductor of the base layer 32. For example, the base layer 32 and the nanocores 35a may be formed of n-type GaN.

The nitride semiconductor constituting the first conductivity-type semiconductor nanocore 35a may be grown as a single crystal using metal-organic chemical vapor deposition (MOCVD) or molecular beam epitaxy (MBE). The mask layer 33 may act as a mold for the growing nitride single crystal to provide the first conductivity-type semiconductor nanocores 35a corresponding to the shape of the openings H.

As in the exemplary embodiment, an additional heat treatment process may be introduced in order to enhance crystallinity during the process of forming the light emitting nanostructures using the mask layer 33 having openings H as a mold.

After the second mask layer 33b of the mask layer 33 is removed, the surfaces of the first conductivity-type semiconductor nanocores 35a may be heat-treated under predetermined conditions to change a crystal plane of each nanocore 35a into a stable plane advantageous for crystal growth, like a semi-polar or non-polar crystal plane. This process will be described with reference to FIGS. 5A and 5B.

Figure 5A:
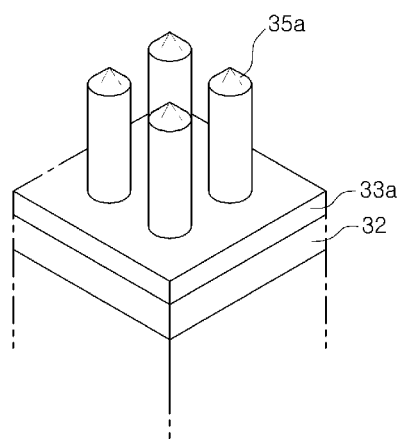
FIGS. 5A and 5B are views illustrating heat treatment processes of nanocores formed of a first conductivity-type semiconductor applicable to the exemplary embodiments of the present disclosure.
Figure 5B:
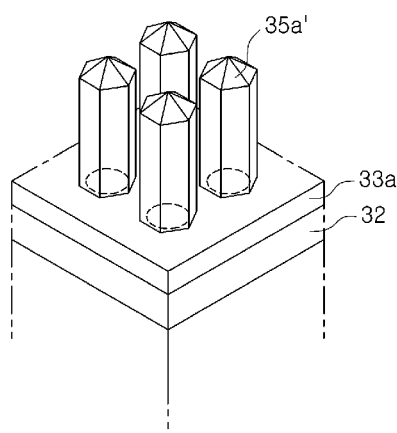

FIGS. 5A and 5B are schematic views illustrating a heat treatment process applicable to the process of FIG. 3B.

FIG. 5A illustrates the first conductivity-type semiconductor nanocores 35a obtained in the process of FIG. 3B. In a case in which the openings H have a cylindrical rod shape, that is, the openings H have a circular cross-section, the side surfaces of the first conductivity-type semiconductor nanocores 35a may be unstable curved surfaces, rather than particular crystal planes, as illustrated in FIG. 5A. When such first conductivity-type semiconductor nanocores 35a are heat-treated, the unstable surfaces thereof are rearranged to have stable crystal planes such as semi-polar or non-polar planes (see FIG. 5B). The heat treatment process may be performed at a temperature equal to or greater than 800° C., for a few minutes to tens of minutes.

For example, when an n-type GaN single crystal is grown to fill the plurality of openings H, the n-type GaN nanocores maybe heat-treated at 800° C. or above to change unstable curved surfaces into non-polar planes (m-planes). Stabilization of the crystal planes may be understood that crystals positioned on the surface of the nanocore are rearranged at a high temperature. Alternatively, the stabilizatioin of the crystal planes may be understood that, when a source gas remains within a chamber, such a residual source gas is deposited to perform partial regrowth to form stable crystal planes.

Figure 3C:
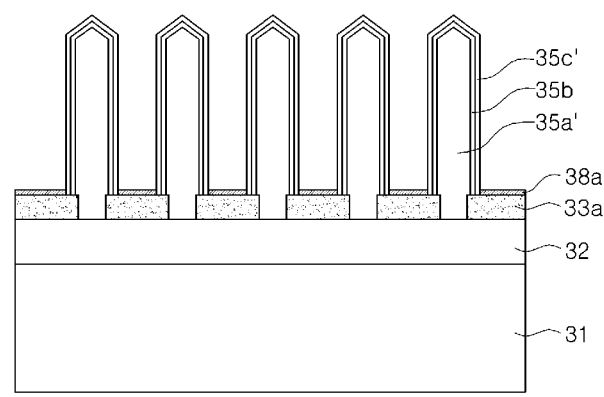

Subsequently, as illustrated in FIG. 3C, the active layer 35*b* and the charge carrier blocking layer 35*c*' are sequentially grown on the surfaces of the heat-treated nanocores 35*a*' as single crystals. During the growth of the charge carrier blocking layer 35*c*', a first polycrystalline layer 38*a* of a polycrystalline current suppressing layer 38 may be formed on the first mask layer 33*a* between the first conductivity-type semiconductor nanocores 35*a*'. The first polycrystalline layer 38*a* may include at least one of the elements constituting the active layer 35*b* and at least one of the elements constituting the first mask layer 33*a*. For example, when the charge carrier blocking layer 35*c*' is formed of AlGaN and the first mask layer 33*a* is formed of $Si_xN_y$, the first polycrystalline layer 18*a* maybe a silicon compound containing aluminium (Al) such as Al-Si-N.

Figure 3D:
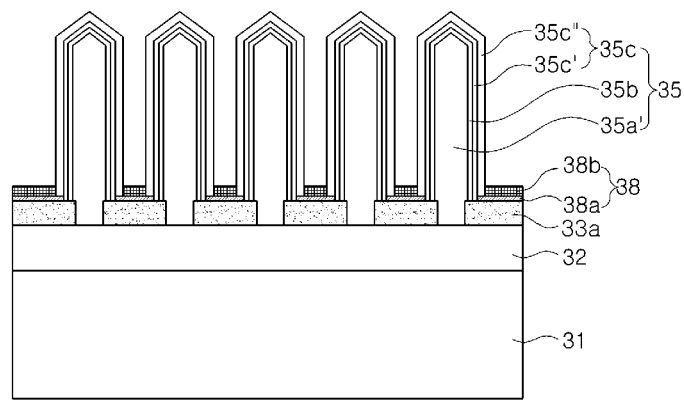

Then, as illustrated in FIG. 3D, the second conductivity-type contact layer 35*c*" maybe grown as a single crystal on the charge carrier blocking layer 35*c*'. Finally, a plurality of light emitting nanostructures 35 may have a core-shell structure including the first conductivity-type semiconductor nanocores 35*a*', the active layer 35*b*' and the second conductivity-type semiconductor layer 35*c*. During this process, a second polycrystalline layer 38*b* may be formed on the first polycrystalline layer 38*a* of a polycrystalline current suppressing layer 38. The second polycrystalline layer 38*b* may be formed of the same compound as that of the second conductivity-type contact layer 35*c*". For example, when the second conductivity-type contact layer 35*c*" is a p-type GaN single crystal layer containing magnesium (Mg) as an impurity, the second polycrystalline layer 38*b* may be a p-type GaN polycrystalline layer containing magnesium (Mg) as the impurity.

The mask used in the above-described exemplary embodiment includes two material layers by way of an example, but the present disclosure is not limited thereto. The mask layer 33 may include three or more material layers.

Figure 6:
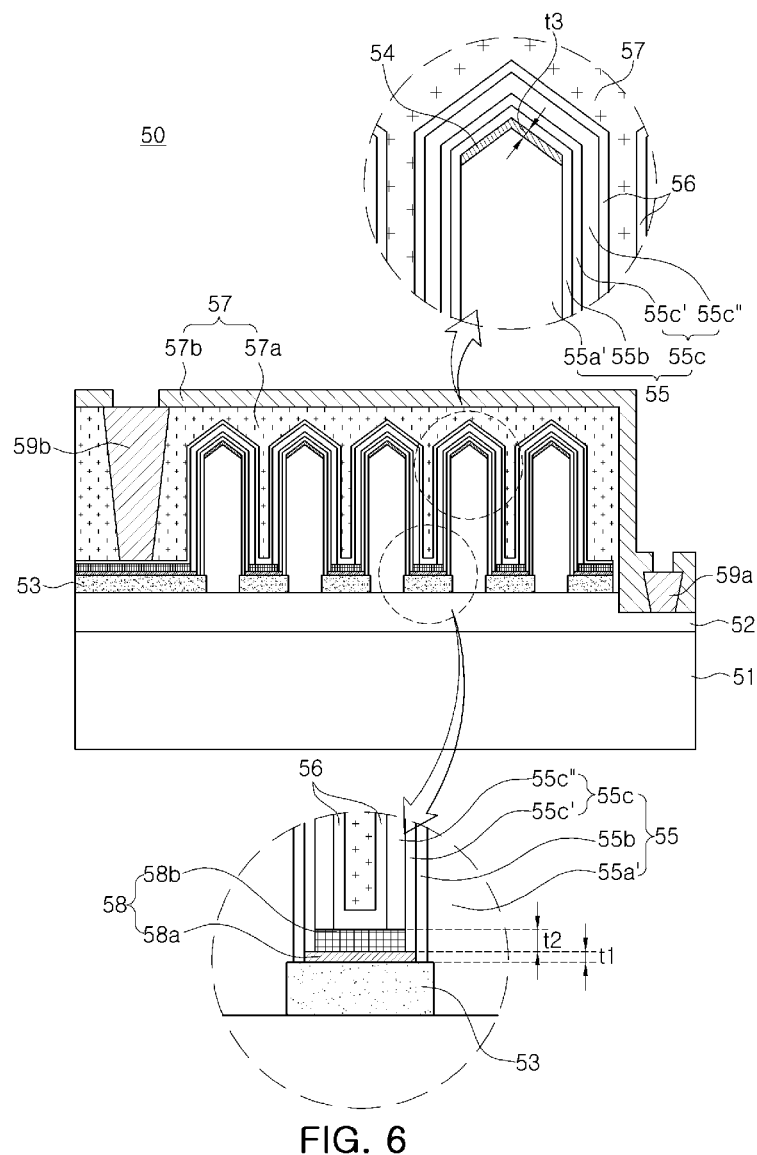
FIG. 6 is a cross-sectional view illustrating the nanostructure semiconductor light emitting device according to another exemplary embodiment of the present disclosure.

FIG. 6 is a cross-sectional view illustrating a nanostructure semiconductor light emitting device further including a current blocking intermediate layer according to another exemplary embodiment of the present disclosure.

A nanostructure semiconductor light emitting device 50 may include a first conductivity-type semiconductor base layer 52, a mask layer 53 disposed on the base layer 52 and having a plurality of openings, a plurality of light emitting nanostructures 55, and a polycrystalline current suppressing layer 58 disposed on the mask layer 53. Each light emitting nanostructure 55 may include a first conductivity-type semiconductor nanocore 55*a*' grown from the first conductivity-type semiconductor base layer 52, an active layer 55*b* and a second conductivity-type semiconductor layer 55*c*. The second conductivity-type semiconductor layer 55*c* may include a charge carrier blocking layer 55*c*' and a second conductivity-type contact layer 55*c*". The nanocore 55*a*' may include a rod portion M and a tip portion T having different crystal planes (see FIG. 2), and may further include a current blocking intermediate layer 54 between the nanocore 55*a*' and the active layer 55*b* in the tip portion T. The nanostructure semiconductor light emitting device 50 may include a contact electrode layer 56 formed on the plurality of light emitting nanostructures 55, a first passivation layer 57*a* formed on the contact electrode layer 56 and filling space between the light emitting nanostructures 55, and a second passivation layer 57*b* formed on the first passivation layer 57*a*. The nanostructure semiconductor light emitting device 50 may further include first and second electrodes 59*a* and 59*b* electrically connected to the first conductivity-type semiconductor base layer 52 and the contact electrode layer 56.

The structure of the nanostructure semiconductor light emitting device 50 illustrated in FIG. 6 is substantially identical to the structure illustrated in FIG. 1, except that the current blocking intermediate layer 54 is further disposed between the nanocore 55*a*' and the active layer 55*b* unlike the structure of FIG. 1. A detailed description of elements which have already described above will be omitted, and the current blocking intermediate layer 54 will be mainly described below.

As illustrated in FIG. 6, the first conductivity-type semiconductor nanocore 55*a*' may include the tip portion T having crystal planes different from those of the rod portion M. For example, the tip portion T of the first conductivity-type semiconductor nanocore 55*a*' may have a hexagonal pyramidal shape (see FIG. 2).

The current blocking intermediate layer 54 maybe formed of a material having high electrical resistance in order to block a leakage current that may be caused at the tip portion T of the first conductivity-type semiconductor nanocore 55*a*'. For example, the current blocking intermediate layer 54 maybe a semiconductor layer not intentionally doped or may be a semiconductor layer doped with a second conductivity-type impurity different from that of the first conductivity-type semiconductor nanocores 55*a*'. For example, in a case in which the nanocores 55*a*' are formed of n-type GaN, the current blocking intermediate layer 54 may be an undoped GaN layer or a GaN layer doped with a p-type impurity.

The current blocking intermediate layer 54 may have a thickness equal to or greater than approximately 50 nm in order to have sufficient electrical resistance. A concentration of the second conductivity-type impurity of the current blocking intermediate layer 54 may be approximately $1.0 \times 10^{16}/cm^3$ or greater. In the case that the current blocking intermediate layer 54 is doped with the second-conductivity type impurity, a thickness and concentration thereof may be appropriately adjusted to be complementary to each other. For example, when the thickness of the current blocking intermediate layer 54 is relatively thin, a doping concentration therein may be increased to secure resistance, and vice versa.

The current blocking intermediate layer 54 used in the exemplary embodiment may only be disposed in the tip portion T of the first conductivity-type semiconductor nanocore 55*a*'. Due to the selective disposition of the current blocking intermediate layer 54, an active layer region disposed on a surface of the tip portion T of the first conductivity-type semiconductor nanocore 55*a*' may not substantially contribute to emitting light. That is, a current flow through the active layer region formed on the rod portion M of the first conductivity-type semiconductor nanocore 55*a*' is normally guaranteed, while a current flow through the active layer region formed on the tip portion T of the first conductivity-type semiconductor nanocore 55*a*' may be blocked by the current blocking intermediate layer 54.

Influence according to crystal planes of the first conductivity-type semiconductor nanocore 55*a*' that maybe used in the exemplary embodiment will be described in detail with reference to FIG. 2.

Figure 2:
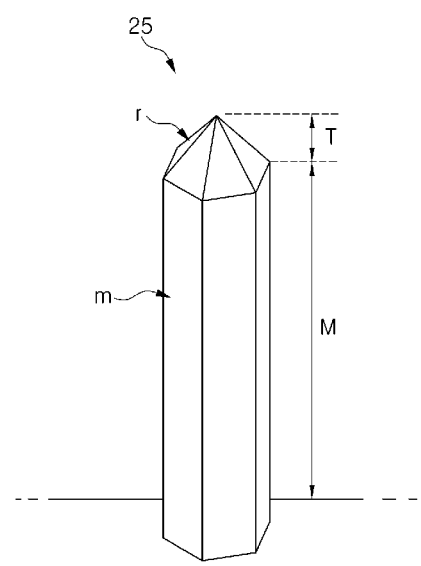
FIG. 2 is a schematic perspective view illustrating an example of a nanocore usable in the exemplary embodiment of the present disclosure.

A first conductivity-type semiconductor nanocore 25 of FIG. 2 maybe divided into a rod portion M having side surfaces which are a first family of crystal planes and a tip portion T having facets which are a second family of crystal planes different from the first family of crystal planes depending on growth directions. In a case in which the first conductivity-type semiconductor nanocore 25 has a crystal structure having a hexagonal system such as a nitride single crystal, the first family of crystal planes may be non-polar (m planes) and the second family of crystal planes may be semi-polar (r planes).

Even in the case that an active layer is grown on the surface of the first conductivity-type semiconductor nanocore 25 using the same process, compositions of the active layer (in particular, the content of indium when an InGaN layer is grown) are varied due to a difference between the characteristics of respective crystal planes, and a wavelength of light generated by the active layer portion grown on the facets (r planes) of the tip portion of the first conductivity-type semiconductor nanocore 25 may be different from a wavelength of light generated by the side surfaces (m planes) of the first conductivity-type semiconductor nanocore 25. As a result, a half-width of the wavelength of emitted light is increased, making it difficult to accurately design light having a desired wavelength. Also, since semiconductor layers (active layer and second conductivity-type semiconductor layer) are grown to be relatively thin on the semi-polar planes of the tip portion T, a leakage current may be generated.

As illustrated in FIG. 6, the current blocking intermediate layer 54 is formed in the tip portion T of the nanocore 25 to reduce the leakage current, enhancing a luminous efficiency. By causing the active layer portion positioned on the tip portion T not to be active in terms of light emissions, a wavelength of the emitted light may be accurately designed.

Besides the nanocore 25 illustrated in FIG. 2, the foregoing current blocking intermediate layer 54 may also be advantageously applied to first conductivity-type semiconductor nanocores 55a' having various crystal structures and shapes in which a particular region has different crystal planes.

The first passivation layer 57a maybe formed of various materials exemplified as forming the filling layer 17 illustrated with reference to FIG. 1. As necessary, the second passivation layer 57b may be additionally formed, and may provide a protective layer 57 together with the first passivation layer 57a. The second passivation layer 57b may cover the exposed semiconductor region to protect the same, and may firmly support the first and second electrodes 59a and 59b as well.

The second passivation layer 58b may be formed of a material identical or similar to that of the first passivation layer 58a.

FIGS. 7A through 7D are cross-sectional views illustrating major processes in a method of manufacturing a nanostructure semiconductor light emitting device according to the exemplary embodiment of the present disclosure.

The method of manufacturing a nanostructure semiconductor light emitting device to be described with reference to FIGS. 7A through 7D is basically identical to the manufacturing method described with reference to FIGS. 3A through 3D, except that a process of forming a current blocking intermediate layer 74 between a first conductivity-type semiconductor nanocore 75a' and an active layer 75b is additionally performed. Hereinafter, the overlapped processes will be briefly described and the process of forming the current blocking intermediate layer 74 will mainly be described.

Figure 7A:
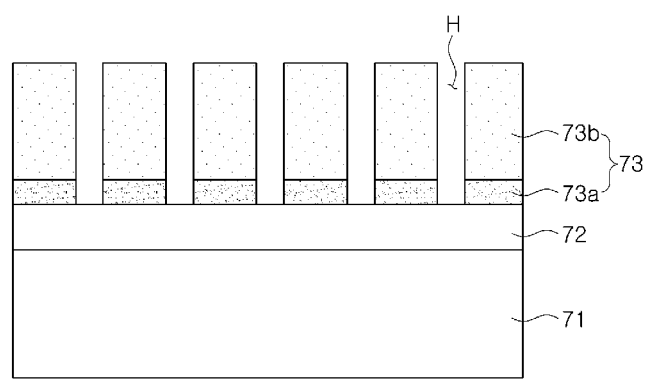
FIGS. 7A through 7D are cross-sectional views illustrating major processes in a method of manufacturing the nanostructure semiconductor light emitting device according to the exemplary embodiment of the present disclosure.

As illustrated in FIG. 7A, a first conductivity-type semiconductor base layer 72 may be formed on a substrate 71. Next, a mask layer 73 including a first mask layer 73a and a second mask layer 73b may be formed on the base layer 72. Thereafter, a plurality of openings H for growing first conductivity-type semiconductor nanocores 75a maybe formed in the mask layer 73.

Figure 7B:
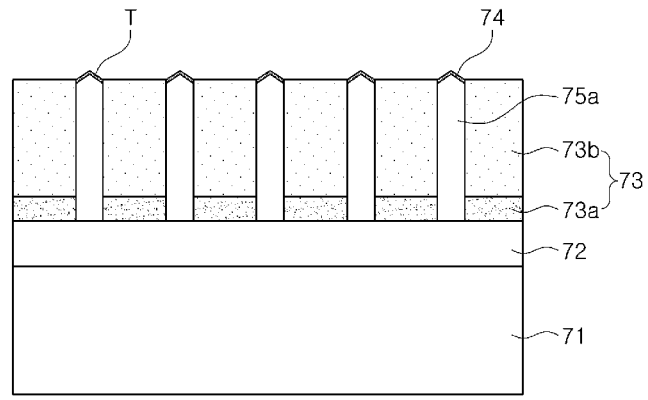

As illustrated in FIG. 7B, a first conductivity-type semiconductor may be grown on the exposed regions of the base layer 72 to fill the plurality of openings H formed in the mask layer 73, thereby forming a plurality of first conductivity-type semiconductor nanocores 75a. Then, with the mask layer 73 retained, the current blocking intermediate layer may be formed on a tip portion T of each first conductivity-type semiconductor nanocore 75a which is exposed above the mask layer 73. In this case, the nanocores 75a and the current blocking intermediate layer 74 may be continuously formed by changing only the types of impurity during the same growth process. Therefore, the current blocking intermediate layer 74 may be easily formed on a desired tip portion of the nanocore 75a without forming an additional mask. A thickness of the current blocking intermediate layer 74 may be equal to or greater than approximately 50 nm in order to have sufficient electrical resistance. The current blocking intermediate layer may not be doped or may be doped with a second conductivity-type impurity different from that of the first conductivity-type semiconductor nanocore 75a.

Figure 7C:
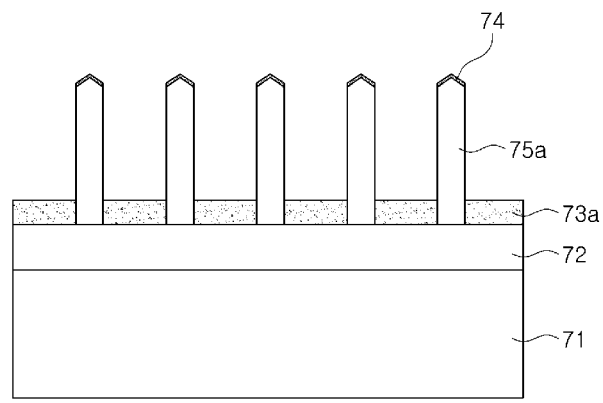
Figure 7D:
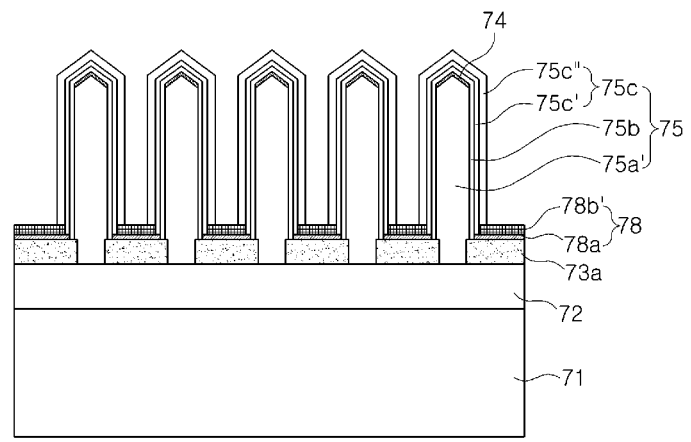

Next, as illustrated in FIG. 7C, while the first mask layer 73a may be retained, only the second mask layer 73b may be removed, such that a portion of the side surfaces of the plurality of first conductivity-type semiconductor nanocores 75a is exposed. Then, the heat treatment process described with reference to FIGS. 5A and 5B may be performed. The active layer 75b and a charge carrier blocking layer 75c' may be sequentially grown on the surfaces of the heat-treated nanocores 75a'. During the growth of the charge carrier blocking layer 75c', a first polycrystalline layer 78a of a polycrystalline current suppressing layer 78 may be formed on the first mask layer 73a between the first conductivity-type semiconductor nanocores 75a'. Then, a second conductivity-type contact layer 75c" may be grown on the charge carrier blocking layer 75c', thereby forming a plurality of light emitting nanostructures 75 having a core-shell structure. During the growth of the second conductivity-type contact layer 75c", a second polycrystalline layer 78b may be formed on the first polycrystalline layer 78a of the polycrystalline current suppressing layer 78.

Hereinafter, conditions of a current blocking intermediate layer together with effects of the present disclosure will be described in detail through specific examples.

A mask layer including two layers of $Si_xN_y/SiO_2$ may be formed on an n-type GaN base layer according to an example embodiment. A plurality of openings may be formed in the mask layer using a dry-etching process. Nanocores formed of a first conductivity-type semiconductor, n-type GaN, may be grown as single crystals using the mask layer as a mold.

After the $SiO_2$ layer, a first mask layer, of the mask layer may be removed and the $Si_xN_y$ layer, a second mask layer, may be retained, the nanocores formed of n-type GaN single crystals may be heat-treated at a temperature of approximately 1100° C. to have stable crystal planes through recrystallization. Subsequently, an InGaN/GaN active layer, a p-type AlGaN electron blocking layer, and a p-type GaN layer may be sequentially formed on surfaces of the first conductivity-type semiconductor nanocores, as single crystals, to form light emitting nanostructures. The electron blocking layer may be grown at 1020° C., under a hydrogen ($H_2$) atmosphere. Through this growth process, a first polycrystalline layer of a polycrystalline current suppressing layer may be grown on the second mask layer between the light emitting nanostructures. The first polycrystalline layer may be formed of an Al-Si-N compound. The p-type GaN layer may be grown at 980° C., under a nitrogen ($N_2$) atmosphere. Through this growth process, a second polycrystalline layer of the polycrystalline current suppressing layer may be grown on the first polycrystalline layer. The second polycrystalline layer may be formed of GaN doped with magnesium (Mg).

An indium tin oxide (ITO) layer may be deposited on surfaces of the light emitting nanostructures, and a filling layer may be formed to cover the light emitting nanostructures while filling space between the light emitting nanostructures. Then, an electrode structure may be formed to thereby manufacture a nanostructure semiconductor light emitting device.

As compared to the aforementioned example embodiment, a p-type AlGaN electron blocking layer may not be formed. Therefore, a nanostructure semiconductor light emitting device according to a comparative example embodiment may be manufactured to have no first and second polycrystalline layers of the polycrystalline current suppressing layer.

A nanostructure semiconductor light emitting device according to an experimental example embodiment may be manufactured to include the polycrystalline current suppressing layer formed by changing the growth atmosphere at the time of growing the p-type GaN layer to the hydrogen ($H_2$) atmosphere in the example embodiment. That is, the second polycrystalline layer of the polycrystalline current suppressing layer may be formed under the hydrogen ($H_2$) atmosphere.

Figure 8A:
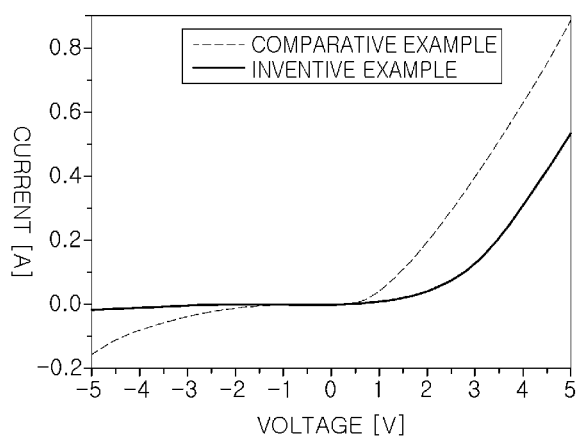
FIGS. 8A and 8B are graphs illustrating leakage current characteristics of the nanostructure semiconductor light emitting device according to the exemplary embodiment of the present disclosure.
Figure 8B:
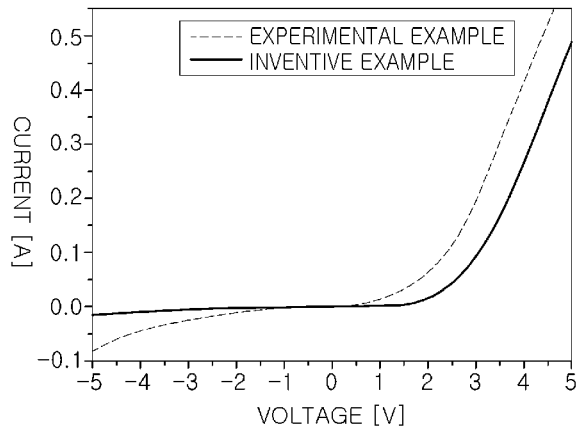

FIGS. 8A and 8B are graphs illustrating leakage current characteristics of a nanostructure semiconductor light emitting device according to an exemplary embodiment of the present disclosure.

With reference to FIG. 8A, in the case of the comparative example embodiment in which no polycrystalline current suppressing layer may be formed because of not growing the electron blocking layer, a current value may be approximately −150 mA at −5V, while in the case of the example embodiment in which the polycrystalline current suppressing layer may be formed by growing the electron blocking layer, a current value may be significantly dropped to approximately −20 mA at −5V.

With reference to FIG. 8B, in the case of the experimental example embodiment in which the first polycrystalline layer of the polycrystalline current suppressing layer may be formed by growing the electron blocking layer and then the p-type GaN layer may be grown under the hydrogen ($H_2$) atmosphere, that is, the second polycrystalline layer of the polycrystalline current suppressing layer may be grown under the hydrogen ($H_2$) atmosphere, a current value may be approximately −80 mA at −5V, while in the case of the example embodiment in which the p-type GaN layer may be grown under the nitrogen ($N_2$) atmosphere, that is, the second polycrystalline layer of the polycrystalline current suppressing layer may be grown under the nitrogen ($N_2$) atmosphere, a current value may be significantly dropped to approximately −20 mA at −5V.

It can be concluded that a leakage current through an interface between the semiconductor nanocore and the mask layer below the semiconductor nanocore is reduced due to the polycrystalline current suppressing layer. Further, when the p-type GaN layer and the second polycrystalline layer of the polycrystalline current suppressing layer are grown under the nitrogen ($N_2$) atmosphere rather than the hydrogen ($H_2$) atmosphere, the leakage current is more effectively reduced.

FIGS. 9A through 9D are cross-sectional views illustrating major processes in a method of forming electrodes for the nanostructure semiconductor light emitting device according to the exemplary embodiment of the present disclosure.

Figure 9A:
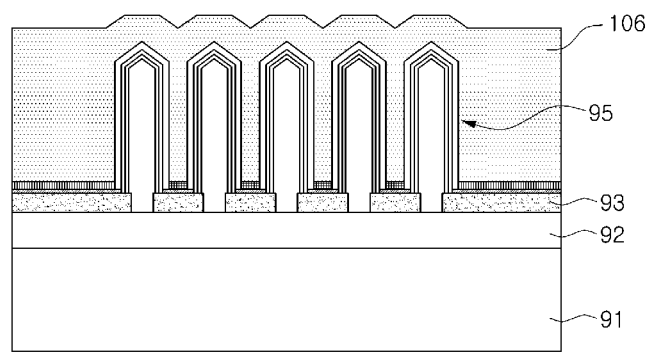
FIGS. 9A through 9D are cross-sectional views illustrating major processes in a method of forming electrodes for the nanostructure semiconductor light emitting device according to the exemplary embodiment of the present disclosure.

First, as illustrated in FIG. 9A, a contact electrode layer 106 is formed on the light emitting nanostructures 95 obtained in FIG. 3D. The contact electrode layer 106 may include an appropriate material implementing an ohmic-contact with the second conductivity-type semiconductor layer on surfaces of the light emitting nanostructures 95. The material for the ohmic-contact may be a GaN layer, an InGaN layer, a ZnO layer or a graphene layer. An ohmic-contact material may include Ag, Ni, Al, Rh, Pd, Ir, Ru, Mg, Zn, Pt, Au, and the like, and may have a structure including two or more layers formed of Ni/Ag, Zn/Ag, Ni/Al, Zn/Al, Pd/Ag, Pd/Al, Ir/Ag, Ir/Au, Pt/Ag, Pt/Al, Ni/Ag/Pt or the like. The ohmic-contact material used for the contact electrode layer 106 may be a reflective metal layer in consideration of a light extraction efficiency.

Figure 9B:
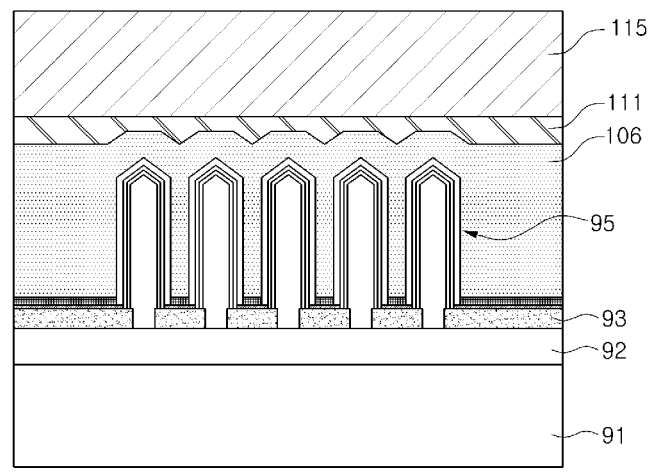

Next, as illustrated in FIG. 9B, a support substrate 115 may be bonded to the contact electrode layer 106.

The support substrate 115 maybe a conductive substrate. For example, the support substrate 115 may be a Si substrate or a Si-Al alloy substrate. The support substrate 115 may be bonded to the contact electrode layer 106 using a bonding metal layer 111. The bonding metal layer 111 may be formed of a metal or an alloy selected among Ni, Pt, Au, Cu, Co, Sn, In, Zn, Bi, Au, W, Ti and alloys thereof. For example, the bonding metal layer 111 maybe a eutectic metal layer formed of Ni/Sn or Au/Sn. In some cases, Ni/Ti, Ti/W or the like may be additionally used as a diffusion barrier layer in order to block elements constituting the bonding metal layer 111 from being diffused into semiconductor layers.

Figure 9C:
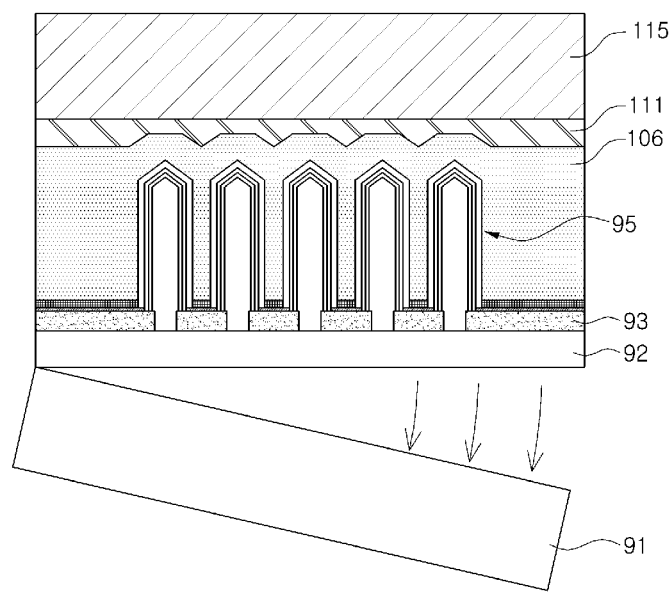

Thereafter, as illustrated in FIG. 9C, a growth substrate 91 used for crystal growth maybe removed from a first conductivity-type semiconductor base layer 92. In some cases, if the growth substrate 91 is a light transmissive substrate, it may not be removed.

The removal of the growth substrate 91 may be performed using a laser lift-off process, a chemical lift-off process, or the like. In the case of using the laser lift-off process, the growth substrate 91 may be separated from the first conductivity-type semiconductor base layer 92 by irradiating a laser beam to an interface between the growth substrate 91 and the first conductivity-type semiconductor base layer 92. In some cases, the laser lift-off process may be performed at a temperature higher than room temperature in order to reduce the warpage of the growth substrate 91 or to reduce stress present in the light emitting structures.

Figure 9D:
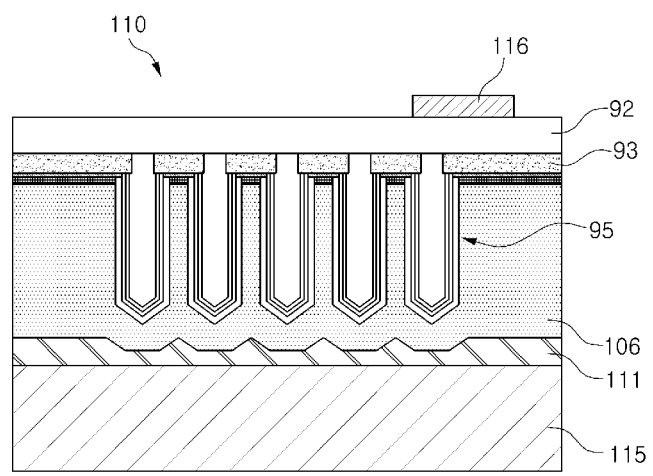

Subsequently, as illustrated in FIG. 9D, an electrode pad 116 maybe formed on a surface of the first conductivity-type semiconductor base layer 92 from which the growth substrate 91 has been removed, to obtain a desired nanostructure semiconductor light emitting device 110. The support substrate 115, a conductive substrate, may be used as an electrode connected to an external circuit.

Figure 10:
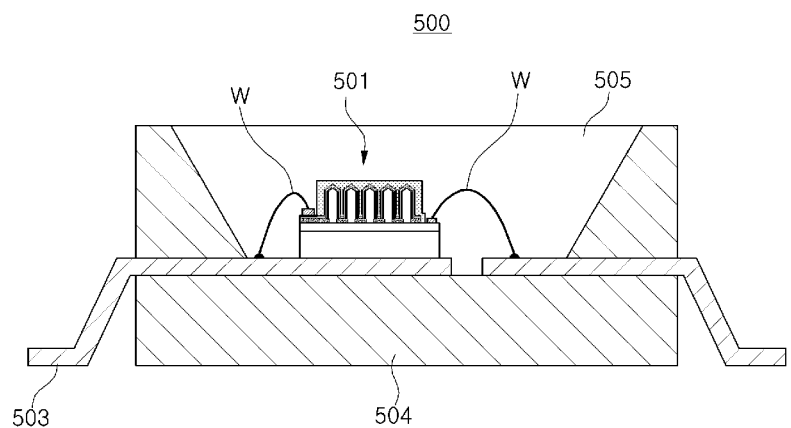
FIGS. 10 and 11 are side cross-sectional views illustrating examples of a package to which the nanostructure semiconductor light emitting device according to the exemplary embodiment of the present disclosure is applied.
Figure 11:
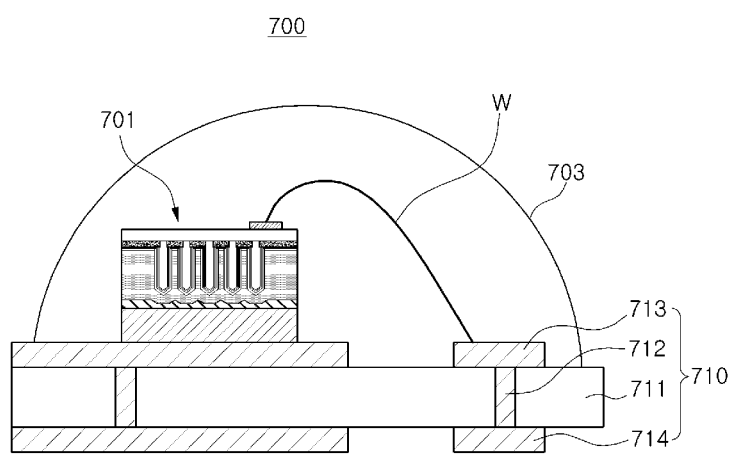

FIGS. 10 and 11 illustrate examples of a semiconductor light emitting device package to which the nanostructure semiconductor light emitting device according to the exemplary embodiment of the present disclosure is applied.

With reference to FIG. 10, a semiconductor light emitting device package 500 may include a nanostructure semiconductor light emitting device 501, a package body 504, and a pair of lead frames 503. The nanostructure semiconductor light emitting device 501 may be mounted on the pair of lead frames 503 to be electrically connected to the pair of lead frames 503 through wires W. According to exemplary embodiments, the nanostructure semiconductor light emitting device 501 may be mounted on a different region, for example, on the package body 504, rather than on the pair of lead frames 503. Also, the package body 504 may have a cup shape to improve a reflective efficiency of light. An encapsulation body 505 formed of a light-transmissive material maybe formed in the reflective cup to encapsulate the nanostructure semiconductor light emitting device 501, the wires, and the like.

In the exemplary embodiment, the semiconductor light emitting device package 500 includes the nanostructure semiconductor light emitting device 501 having the same structure as that of the nanostructure semiconductor light emitting device 10 of FIG. 1. Alternatively, the semiconductor light emitting device package 500 may include the nanostructure semiconductor light emitting device 50 of FIG. 6. However, the present disclosure is not limited thereto, and the semiconductor light emitting device package 500 may include various types of semiconductor light emitting device having a flip-chip structure.

With referent to FIG. 11, a semiconductor light emitting device package 700 may include a nanostructure semiconductor light emitting device 701, a mounting board 710, and an encapsulation body 703. The nanostructure semiconductor light emitting device 701 may be mounted on the mounting board 710 to be electrically connected to the mounting board 710 through a wire W and the conductive substrate 115 (see FIG. 9D).

The mounting board 710 may include a body 711, an upper electrode 713, and a lower electrode 714. In addition, the mounting board 710 may further include a through electrode 712 connecting the upper electrode 713 and the lower electrode 714. The mounting board 710 may be provided as a board such as a printed circuit board (PCB), a metal core printed circuit board (MCPCB), a metal printed circuit board (MPCB), a flexible printed circuit board (FPCB), or the like. The structure of the mounting board 710 may be modified to have various forms.

The encapsulation body 703 may be formed to have a lens structure of which an upper surface has a convex dome shape. However, according to exemplary embodiments, the encapsulation body 703 may have a lens structure having a convex or concave surface to adjust an angle of light emitted through the upper surface of the encapsulation body 703.

In the exemplary embodiment, the semiconductor light emitting device package 700 may include the nanostructure semiconductor light emitting device 701 having the same structure as that of the nanostructure semiconductor light emitting device 110 of FIG. 9D. Alternatively, the semiconductor light emitting device package 700 may include the nanostructure semiconductor light emitting device 10 or 50 of FIG. 1 or 6.

Figure 12:
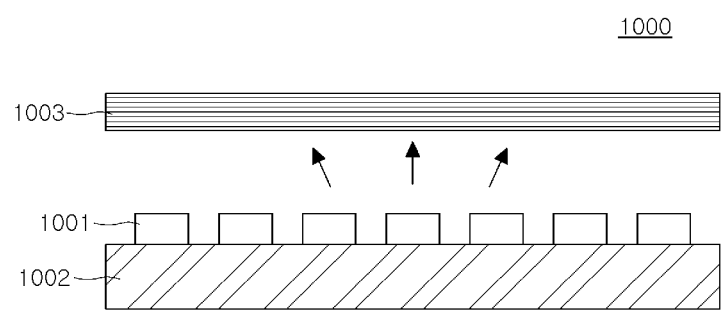
FIGS. 12 and 13 illustrate examples of a backlight unit to which the nanostructure semiconductor light emitting device according to the exemplary embodiment of the present disclosure is applied.
Figure 13:
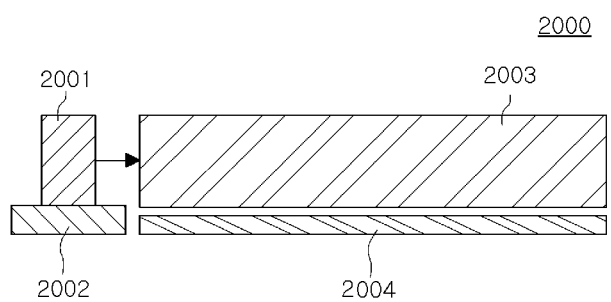

FIGS. 12 and 13 illustrate examples of a backlight unit to which a nanostructure semiconductor light emitting device according to the exemplary embodiment of the present disclosure is applied.

Referring to FIG. 12, a backlight unit 1000 may include at least one light source 1001 mounted on a substrate 1002 and at least one optical sheet 1003 disposed above the light source 1001. The aforementioned nanostructure semiconductor light emitting device or the aforementioned package having the nanostructure semiconductor light emitting device may be used as the light source 1001.

The light source 1001 in the backlight unit 1000 of FIG. 12 may emit light toward a liquid crystal display (LCD) device disposed thereabove. A light source 2001 mounted on a substrate 2002 in a backlight unit 2000 as another example illustrated in FIG. 13 may emit light laterally. The light may be incident to a light guide plate 2003 such that the backlight unit 2000 may serve as a surface light source. The light travelling to the light guide plate 2003 may be emitted upwardly and a reflective layer 2004 maybe disposed below a lower surface of the light guide plate 2003 in order to improve a light extraction efficiency.

Figure 14:
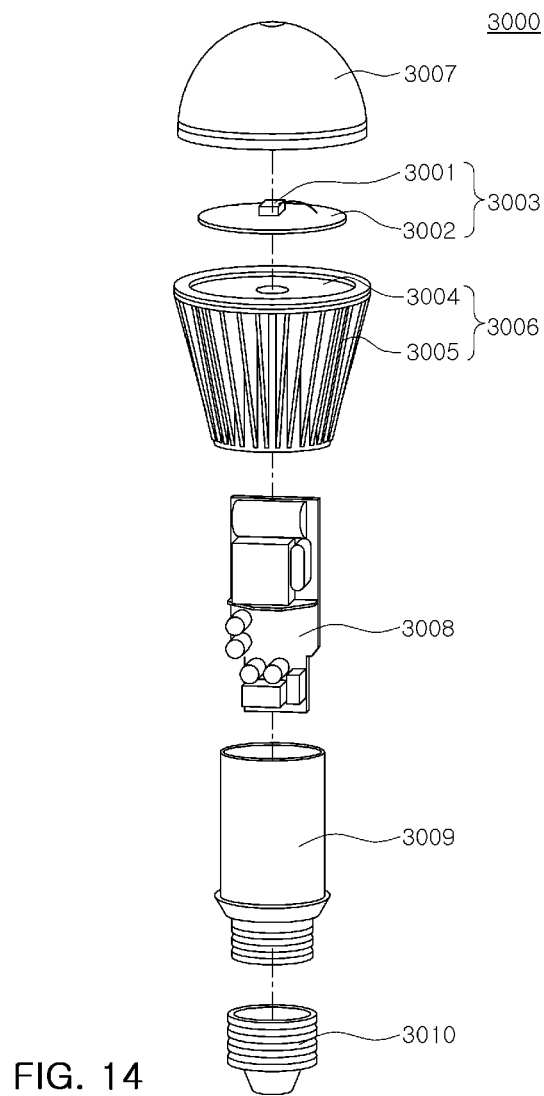
FIG. 14 illustrates an example of a lighting device to which the nanostructure semiconductor light emitting device according to the exemplary embodiment of the present disclosure is applied.

FIG. 14 is an exploded perspective view illustrating an example of a lighting device to which the nanostructure semiconductor light emitting device according to the exemplary embodiment of the present disclosure is applied.

A lighting device 3000 is illustrated, for example, as a bulb-type lamp in FIG. 14, and may include alight emitting module 3003, a driver 3008, and an external connector 3010.

In addition, the lighting device 3000 may further include exterior structures such as external and internal housings 3006 and 3009, a cover 3007, and the like. The light emitting module 3003 may include a light source 3001 having the aforementioned nanostructure semiconductor light emitting device package structure or a structure similar thereto, and a circuit board 3002 on which the light source 3001 is mounted. For example, first and second electrodes of the nanostructure semiconductor light emitting device may be electrically connected to an electrode pattern of the circuit board 3002. In the exemplary embodiment, a single light source 3001 may be mounted on the circuit board 3002 by way of example. However, a plurality of light sources may be mounted thereon as necessary.

The external housing 3006 may serve as a heat radiator. The external housing 3006 may include a heat sink plate 3004 directly contacting the light emitting module 3003 to improve heat dissipation. The external housing 3006 may also include heat radiating fins 3005 surrounding a lateral surface of the lighting device 3000. The cover 3007 may be disposed above the light emitting module 3003 and have a convex lens shape. The driver 3008 may be disposed inside the internal housing 3009 and be connected to the external connector 3010 such as a socket structure to receive power from an external power source. In addition, the driver 3008 may convert the received power into power appropriate for driving the light source 3001 of the light emitting module 3003 and supply the converted power thereto. For example, the driver 3008 may be configured as an AC-DC converter, a rectifying circuit part, or the like.

Figure 15:
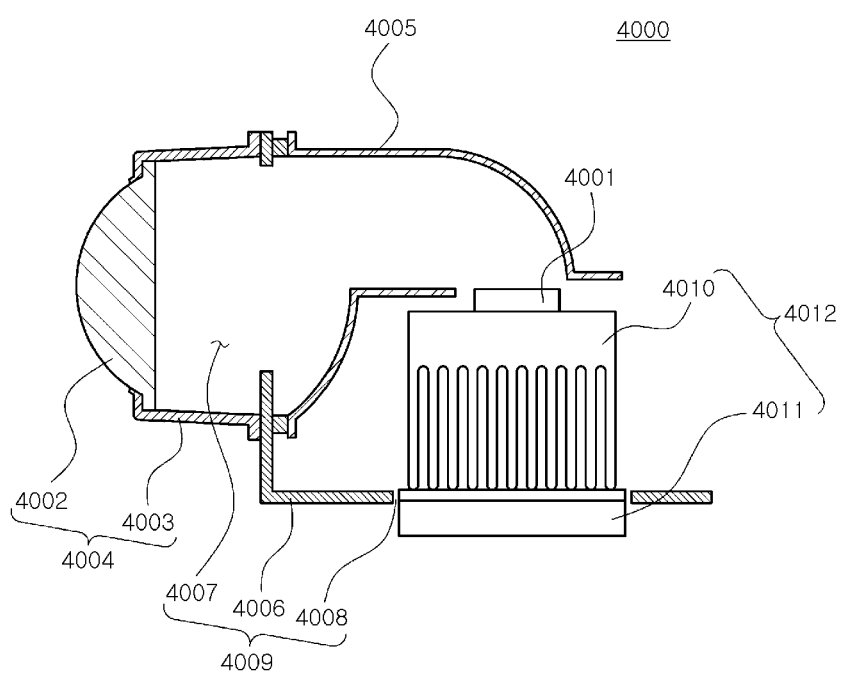
FIG. 15 illustrates an example of a headlamp to which the nanostructure semiconductor light emitting device according to the exemplary embodiment of the present disclosure is applied.

FIG. 15 illustrates an example of a headlamp to which the nanostructure semiconductor light emitting device according to the exemplary embodiment of the present disclosure is applied.

With reference to FIG. 15, a headlamp 4000 used in a vehicle or the like may include a light source 4001, a reflector 4005 and a lens cover 4004, and the lens cover 4004 may include a hollow guide part 4003 and a lens 4002. The light source 4001 may include the aforementioned nanostructure semiconductor light emitting device or the aforementioned package having the same.

The headlamp 4000 may further include a heat radiator 4012 externally dissipating heat generated in the light source 4001. The heat radiator 4012 may include a heat sink 4010 and a cooling fan 4011 in order to effectively dissipate heat. In addition, the headlamp 4000 may further include a housing 4009 allowing the heat radiator 4012 and the reflector 4005 to be fixed thereto and supporting them. The housing 4009 may include a body 4006 and a central hole 4008 formed in one surface thereof, to which the heat radiator 4012 is coupled.

The housing 4009 may include a forwardly open hole 4007 formed in one surface thereof that is integrally connected to the other surface thereof and bent in a direction perpendicular thereto. The reflector 4005 may be fixed to the housing 4009, such that light generated in the light source 4001 may be reflected by the reflector 4005, pass through the forwardly open hole 4007, and be emitted outwardly.

As set forth above, according to exemplary embodiments of the present disclosure, a high efficiency semiconductor light emitting device maybe provided by reducing a leakage current that occurs between the mask layer and the semiconductor layers in a lower portion of the light emitting nanostructure and by effectively blocking the leakage current from passing in an upper portion of the light emitting nanostructure.

While exemplary embodiments have been shown and described above, it will be apparent to those skilled in the art that modifications and variations could be made without departing from the spirit and scope of the present disclosure as defined by the appended claims.

What is claimed is:

1. A nanostructure semiconductor light emitting device, comprising:
   a first conductivity-type semiconductor base layer;
   a mask layer disposed on the base layer and having a plurality of openings exposing portions of the base layer;
   a plurality of light emitting nanostructures disposed on the base layer, each of the plurality of light emitting nanostructures being disposed through the respective opening of the plurality of openings, each of the plurality of light emitting nanostructures including a first conductivity-type semiconductor nanocore, an active layer and a second conductivity-type semiconductor layer; and
   a polycrystalline current suppressing layer disposed on the mask layer,
   wherein at least a portion of the polycrystalline current suppressing layer is disposed below the second conductivity-type semiconductor layer.

2. The nanostructure semiconductor light emitting device of claim 1, wherein the second conductivity-type semiconductor layer includes:
   a charge carrier blocking layer disposed on the active layer; and
   a second conductivity-type contact layer disposed on the charge carrier blocking layer.

3. The nanostructure semiconductor light emitting device of claim 2, wherein the polycrystalline current suppressing layer includes:
   a first polycrystalline layer disposed on the mask layer, the first polycrystalline layer contacting with the charge carrier blocking layer; and
   a second polycrystalline layer disposed on the first polycrystalline layer, the second polycrystalline layer contacting with the second conductivity-type contact layer.

4. The nanostructure semiconductor light emitting device of claim 3, wherein the first polycrystalline layer includes at least one of elements constituting the charge carrier blocking layer and at least one of elements constituting the mask layer.

5. The nanostructure semiconductor light emitting device of claim 3, wherein the charge carrier blocking layer includes a semiconductor single crystal layer containing aluminium,
   the mask layer includes a silicon compound having electrical insulating properties, and
   the first polycrystalline layer includes a polycrystalline layer formed of a silicon compound containing aluminium.

6. The nanostructure semiconductor light emitting device of claim 1, wherein the mask layer is formed of a silicon oxide, a silicon nitride or a silicon oxynitride.

7. The nanostructure semiconductor light emitting device of claim 3, wherein the second polycrystalline layer includes a polycrystalline layer formed of the same compound as that of the second conductivity-type contact layer.

8. The nanostructure semiconductor light emitting device of claim 1, wherein the polycrystalline current suppressing layer has a thickness of 30 nm to 400 nm.

9. The nanostructure semiconductor light emitting device of claim 1, further comprising a contact electrode layer disposed on the second conductivity-type semiconductor layer and the polycrystalline current suppressing layer.

10. The nanostructure semiconductor light emitting device of claim 1, further comprising a filling layer disposed on the contact electrode layer, the filling layer filling space between the plurality of light emitting nanostructures.

11. The nanostructure semiconductor light emitting device of claim 1, wherein the first conductivity-type semiconductor nanocore includes a rod portion and a tip portion, the rod portion having a crystal plane different from the crystal plane of the tip portion, and
   the nanostructure semiconductor light emitting device further comprises a current blocking intermediate layer in the tip portion, the current blocking intermediate layer being positioned between the first conductivity-type semiconductor nanocore and the active layer.

12. The nanostructure semiconductor light emitting device of claim 10, wherein the current blocking intermediate layer is either undoped or doped with a conductivity-type impurity different from the conductivity-type impurity of the first conductivity-type semiconductor nanocore.

13. A nanostructure semiconductor light emitting device, comprising:
   a first conductivity-type semiconductor base layer;
   an insulating layer disposed on the base layer and having a plurality of openings exposing portions of the base layer;
   a plurality of light emitting nanostructures disposed on the base layer, each of the plurality of light emitting nanostructures being disposed through the respective opening of the plurality of openings, each of the plurality of light emitting nanostructures including a first conductivity-type semiconductor nanocore, an active layer and a second conductivity-type semiconductor layer;
   a polycrystalline current suppressing layer disposed on the insulating layer and formed of a polycrystalline compound containing at least a portion of elements constituting the second conductivity-type semiconductor layer;
   a first electrode formed of a conductive material and disposed on an exposed portion of the base layer; and
   a second electrode formed of the conductive material.

14. The nanostructure semiconductor light emitting device of claim 13, wherein the plurality of light emitting nanostructures are formed of a nitride semiconductor material,
   the second conductivity-type semiconductor layer includes a nitride semiconductor layer containing aluminium, and
   the at least a portion of elements constituting the second conductivity-type semiconductor layer includes aluminium.

15. The nanostructure semiconductor light emitting device of claim 14, wherein the nitride semiconductor layer containing aluminium is a charge carrier blocking layer disposed on the active layer, and the polycrystalline current suppressing layer contacts with the charge carrier blocking layer.

16. A semiconductor light emitting device package comprising:
   a package body;
   one or more lead frames; and
   a nanostructure semiconductor light emitting device mounted either on the package body or on the one or more lead frames, the nanostructure semiconductor light emitting device being electrically connected to the one or more lead frames through wires, the nanostructure semiconductor light emitting device including:

a base layer;

a mask layer disposed on the base layer and having a plurality of openings exposing portions of the base layer;

a plurality of light emitting nanostructures disposed on the base layer, each of the plurality of light emitting nanostructures being disposed through the respective opening of the plurality of openings;

a polycrystalline current suppressing layer disposed on the mask layer;

a first electrode formed of a conductive material and disposed on an exposed portion of the base layer; and a second electrode formed of the conductive material.

17. The semiconductor light emitting device package of claim 16, wherein each of the plurality of light emitting nanostructures including a first conductivity-type semiconductor nanocore, an active layer and a second conductivity-type semiconductor layer.

18. The semiconductor light emitting device package of claim 17, wherein the polycrystalline current suppressing layer is formed of a polycrystalline compound containing at least a portion of elements constituting the second conductivity-type semiconductor layer.

19. The semiconductor light emitting device package of claim 16, further comprising an encapsulation body formed of a light-transmissive material, the encapsulation body encapsulating the nanostructure semiconductor light emitting device and the wires.

20. The semiconductor light emitting device package of claim 17, wherein the first conductivity-type semiconductor nanocore is grown from the base layer.

* * * * *